US011112842B1

United States Patent
Smith et al.

(10) Patent No.: US 11,112,842 B1
(45) Date of Patent: Sep. 7, 2021

(54) RESETTING QUBITS IN A SUPERCONDUCTING QUANTUM PROCESSOR

(71) Applicant: Rigetti & Co, Inc., Berkeley, CA (US)

(72) Inventors: Robert Stanley Smith, Emeryville, CA (US); Nikolas Anton Tezak, Oakland, CA (US)

(73) Assignee: Rigetti & Co, Inc., Berkeley, CA (US)

( * ) Notice: Subject to any disclaimer, the term of this patent is extended or adjusted under 35 U.S.C. 154(b) by 503 days.

(21) Appl. No.: 16/150,776

(22) Filed: Oct. 3, 2018

Related U.S. Application Data (60) Provisional application No. 62/569,129, filed on Oct. 6, 2017.

(51) Int. Cl.
| | | |
|---|---|---|
| *G06F 1/24* | (2006.01) | |
| *G06N 10/00* | (2019.01) | |
| *G11B 7/24* | (2013.01) | |
| *H03K 3/38* | (2006.01) | |

(52) U.S. Cl.
CPC .............. *G06F 1/24* (2013.01); *G06N 10/00* (2019.01); *G11B 2007/240025* (2013.01); *H03K 3/38* (2013.01); *Y10S 977/933* (2013.01)

(58) Field of Classification Search
CPC .................................. G06N 10/00; H03K 3/38
See application file for complete search history.

(56) References Cited

U.S. PATENT DOCUMENTS

| | | | | |
|---|---|---|---|---|
| 10,235,635 | B1* | 3/2019 | Abdo | G06N 10/00 |
| 2019/0392344 | A1* | 12/2019 | Kelly | G06N 10/00 |
| 2020/0387822 | A1* | 12/2020 | Kilmov | G06N 10/00 |

OTHER PUBLICATIONS

Johnson, et al., "Quantum non-demolition detection of single microwave photons in a circuit", Nature Physics, vol. 6, Jun. 20, 2010, 6 pgs.
Kelly, et al., "State preservation by repetitive error detection in a superconducting quantum circuit", arXiv:1411.7403, Nov. 26, 2014, 32 pgs.

(Continued)

*Primary Examiner* — Terrell S Johnson
(74) *Attorney, Agent, or Firm* — Henry Patent Law Firm PLLC (57) ABSTRACT

In a general aspect, a tunable qubit device is identified that exhibits a frequency-dependent energy relaxation process in a quantum processor cell. The frequency-dependent energy relaxation process is produced by a material defect in the quantum processor cell. A first qubit frequency associated with a first relaxation time of the tunable qubit device is identified and a second qubit frequency associated with a second relaxation time of the tunable qubit device is identified. The second relaxation time is shorter than the first due to the frequency-dependent energy relaxation process produced by the material defect. The tunable qubit device is operated at the first qubit frequency while processing quantum information in the quantum processor cell. The tunable qubit device is tuned from the first qubit frequency to the second qubit frequency. A qubit state of the qubit device is reset by the frequency-dependent energy relaxation process produced by the material defect.

23 Claims, 4 Drawing Sheets

(56) References Cited

OTHER PUBLICATIONS

Reed, et al., ""Fast reset and suppressing spontaneous emission of a superconducting qubit," Appl. Phys. Lett., vol. 96, 203110", 2010, 3 pgs.

Wong, et al., "A tunable quantum dissipator for active resonator reset in circuit QED", arXiv:1806.01880v2, Jul. 12, 2018, 13 pgs.

* cited by examiner

RESETTING QUBITS IN A SUPERCONDUCTING QUANTUM PROCESSOR

CROSS-REFERENCE TO RELATED APPLICATIONS

This application claims priority to U.S. Provisional Application Ser. No. 62/569,129 entitled "Resetting Qubits in a Superconducting Quantum Processor" and filed on Oct. 6, 2017. The priority application is incorporated herein by reference.

BACKGROUND

The following description relates to resetting qubits in a superconducting quantum processor. In some quantum computing architectures, qubits are implemented in microwave integrated circuits. For example, qubits can be implemented in circuit devices that include Josephson junctions.

DETAILED DESCRIPTION

In some aspects of what is described here, qubits in a superconducting quantum processor are reset. For example, a qubit reset operation can selectively set one or more qubits in a quantum processor to a known quantum state from any arbitrary state. Qubit reset operations can be utilized in quantum processors, for instance, to prepare an input state, to clear a state in memory, to execute quantum algorithms, to increase utilization of physical qubits, to execute quantum error correcting codes, or to perform other types of operations. For instance, a quantum algorithm may need a logical qubit only for a short period of time. If two logical qubits are needed but for non-overlapping times, then an active reset operation can be applied to reuse a single physical qubit.

In some implementations, the process of resetting a qubit includes tuning the qubit device to an operating state where the qubit experiences rapid relaxation (and has a low $T_1$ value). In such an operating state, the $T_1$ relaxation process can more quickly transfer energy from the qubit to the qubit's environment, thus transitioning the qubit more rapidly to the qubit's ground state. This type of process can be utilized as a qubit reset gate or another type of reset operation in a quantum processor. Reducing the time to reset qubits in a quantum processor can improve operation of the quantum processor and increase viability of the quantum processor's functionality.

In a superconducting quantum processor, qubit states can be defined in respective qubit devices (e.g., in a transmon qubit device, fluxonium qubit device, etc.) in a quantum integrated circuit, and the qubit's overall rate of energy relaxation produced by coupling between the qubit and its environment can be described or characterized by the qubit's $T_1$ value. In some cases, the $T_1$ relaxation process can be described as an exponential probability transfer process, where the probability of finding the qubit in the ground state increases over time, for example, according to $$P(t) \propto (1 - e^{-t/T_1}).$$

The $T_1$ relaxation process can have another form or characteristic. The energy relaxation time scale $T_1$ can depend on the qubit frequency, for example, because additional electromagnetically interacting degrees of freedom present on a superconducting quantum processor such as fabrication defects and two-level systems (TLSs) have certain resonant frequencies and can provide energy relaxation channels.

In some examples, flux-tunable qubits exhibit different stability characteristics over their tunable frequency range. In some cases, there are generally uncharacteristically low stability regions, which can be advantageously used for qubit reset operations. For example, an unstable operating state of a qubit device can be detected and used for bringing the qubit to a ground state or randomly-generated phase state. This can provide, for example, exponential control on reset with a simple mode of operation. In some implementations, a control sequence tunes the flux frequency to the unstable region (e.g., the short-$T_1$ region) for a specified amount of time (e.g., an amount of time corresponding to $T_1$ or some multiple of $T_1$), and then tunes the flux frequency back to the stable region (e.g., the long-$T_1$ region). In this manner, flux tuning can be used for dephasing a qubit or transferring energy from a qubit, and bringing the qubit to a ground state.

In some cases, the qubit reset process holds the qubit device in the short-$T_1$ operating state for a specified time, for example, long enough to provide a sufficiently high probability of finding the qubit in its ground state. After the qubit reset process, the qubit device can be tuned back to an operating state where the qubit has a higher $T_1$ value. In such an operating state, the $T_1$ relaxation process is significantly slower and energy is preserved in the qubit for a significantly longer time, thus preserving an arbitrary computational state of the qubit (e.g., during a quantum algorithm or other operation of the quantum processor). In some cases, the qubit device can be held in long-$T_1$ operating states throughout a computation process in which the qubit is used, for example, throughout a quantum algorithm or until the qubit needs to be reset again.

In a superconducting quantum processor, a qubit device can be tuned between operating states that have different $T_1$ values, for example, by tuning the qubit frequency of the device (the frequency corresponding to the energy difference between the qubit's computational basis states |0> or |1>). For instance, in a fluxonium qubit device, a tunable transmon qubit device, or another qubit device that contains a SQUID loop, the qubit frequency can be tuned by modifying (increasing or decreasing) an offset magnetic field that threads the SQUID loop. As such, the effective $T_1$ value can be controlled by controlling an offset field experienced by the qubit device, and the qubit can be moved between a short-$T_1$ state (for reset operations) and a long-$T_1$ state (for computations and other operations).

In some cases, the process of resetting a qubit transitions the qubit from an arbitrary state to a known computational state. For instance, a reset operation may deterministically transition the qubit to a well-characterized computational state, such as, for example, a computational basis state |0> or |1>) or another well-characterized computational state, regardless of what state the qubit was in before the reset operation. In some examples, the reset operation resets a qubit to a well-characterized physical state, such as, for example, its ground state |g> or its first excited state |e>. A qubit reset operation may be selectively applied to an individual qubit, or it may be applied collectively to a group of qubits (e.g., to clear a block of memory). In some cases, applying the qubit reset operation to an individual qubit removes any entanglement between the individual qubit and other quantum subsystems (e.g. other qubits in the quantum processor, the environment, etc.).

The techniques described here can be used to provide technical advantages and improvements in the operation of a quantum computing system. For example, it is often useful to have a qubit reset process that is fast, accurate and deterministic. A faster qubit reset operation may generally improve the computing speed of the quantum processor, for instance, by reducing the time required to prepare initial states or intermediate input states, thus reducing the time required to execute quantum algorithms and other quantum processor functions. A more accurate qubit reset operation may generally improve the computational fidelity of a quantum processor, for instance, by reducing or eliminating errors in an initial state or other input state provided in a quantum algorithm executed by the quantum processor. An improved qubit reset process may provide other advantages. A deterministic qubit reset operation may generally improve accuracy and computing speed, for example, reducing or eliminating the need for measurement and correction operations, and associated latency associated with such operations.

Figure 1:
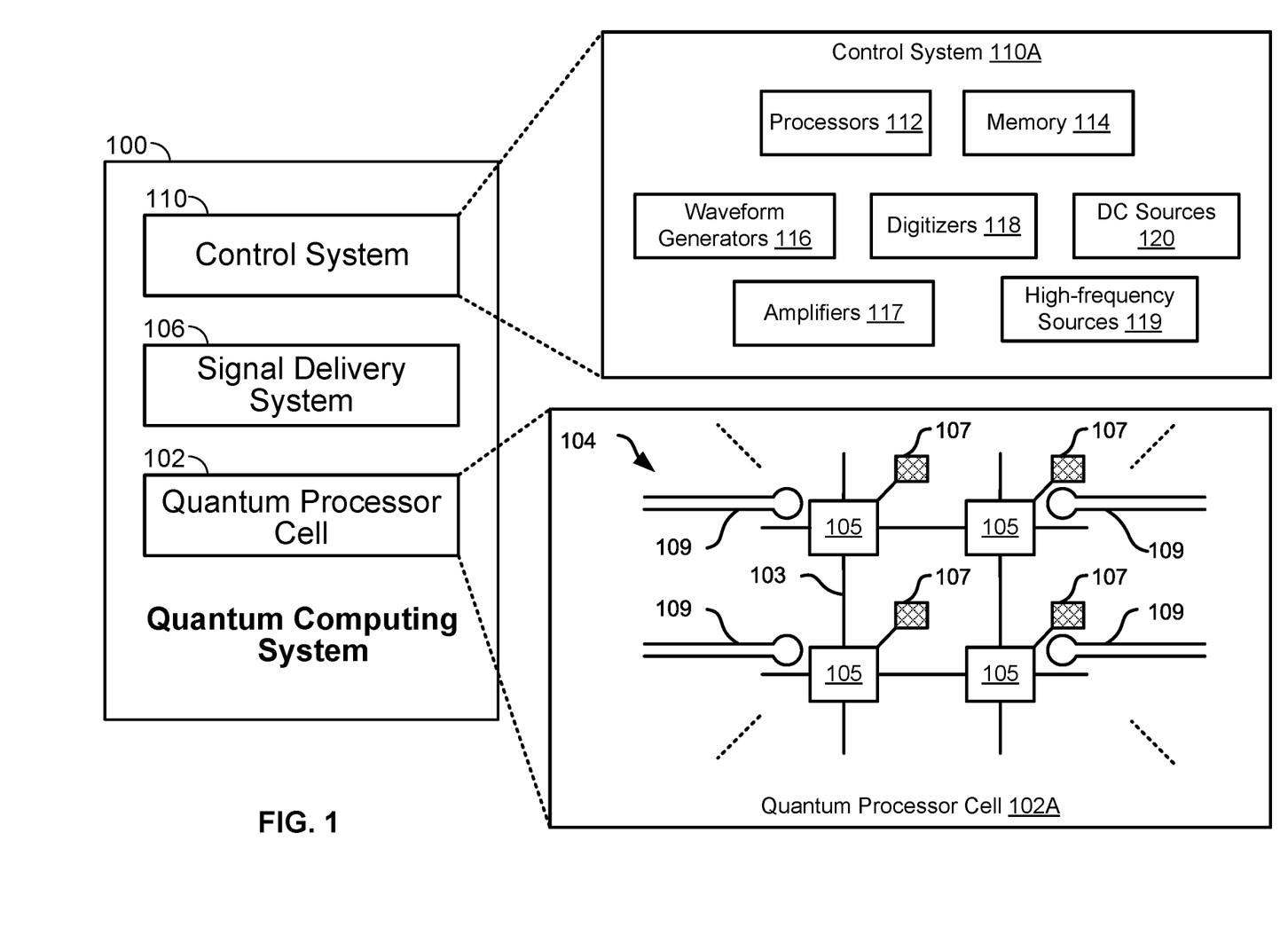
FIG. 1 is a block diagram of an example quantum computing system.

FIG. 1 is a schematic diagram of an example quantum computing system 100. The example quantum computing system 100 shown in FIG. 1 includes a control system 110, a signal delivery system 106, and a quantum processor cell 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. In some instances, quantum logic can be executed in a manner that allows large-scale entanglement within the quantum system. Control signals can manipulate the quantum states of individual qubits and the joint states of multiple qubits. In some instances, information can be read out from the composite quantum system by measuring the quantum states of the qubits.

In some implementations, the quantum computing system 100 can operate using gate-based models for quantum computing. For example, the qubits can be initialized in an initial state, and a quantum logic circuit comprised of a series of quantum logic gates can be applied to transform the qubits and extract measurements representing the output of the quantum computation. In some implementations, the quantum computing system 100 can operate using adiabatic models for quantum computing. For instance, the qubits can be initialized in an initial state, and the controlling Hamiltonian can be transformed adiabatically by adjusting control parameters to another state that can be measured to obtain an output of the quantum computation.

In some models, fault-tolerance can be achieved by applying a set of high-fidelity control and measurement operations to the qubits. For example, topological quantum error correction schemes can operate on a lattice of nearest-neighbor coupled qubits. In some instances, these and other types of quantum error correcting schemes can be adapted for a two- or three-dimensional lattice of nearest neighbor coupled qubits, for example, to achieve fault-tolerant quantum computation. Adjacent pairs of qubits in the lattice can be addressed, for example, with two-qubit logic operations that are capable of generating entanglement, independent of other pairs in the lattice. In some implementations, the quantum computing system 100 is constructed and operated according to a scalable quantum computing architecture. For example, in some cases, the architecture can be scaled to a large number of qubits to achieve large-scale general-purpose coherent quantum computing.

In some instances, all or part of the quantum processor cell 102 functions as a quantum processor, a quantum memory, or another type of subsystem. In some examples, the quantum processor cell 102 includes a quantum integrated circuit system, such as, for example, the quantum integrated circuit systems shown in FIGS. 1, 3, 4, or another type of quantum integrated circuit system. The quantum integrated circuit system may include qubit devices, resonator devices, and possibly other devices that are used to store and process quantum information. In some cases, the quantum integrated circuit system is a superconducting circuit, and the qubit devices are implemented as circuit devices that include Josephson junctions, for example, in superconducting quantum interference device (SQUID) loops or other arrangements, and are controlled by radio-frequency signals, microwave signals, and bias signals delivered to the quantum processor cell 102.

In some implementations, the example quantum processor cell 102 can process quantum information by applying control signals to the qubit devices housed in the quantum processor cell 102. The control signals can be configured to encode information in the qubit devices, to process the information by performing quantum logic gates or other types of operations, or to extract information from the qubit devices. In some examples, the operations can be expressed as single-qubit logic gates, two-qubit logic gates, or other types of quantum logic gates that operate on one or more qubits. A sequence of quantum logic operations can be applied to the qubits to perform a quantum algorithm. The quantum algorithm may correspond to a computational task, a quantum error correction procedure, a quantum state distillation procedure, or a combination of these and other types of operations.

FIG. 1 shows an example quantum processor cell 102A that includes a quantum integrated circuit system 104. The example quantum integrated circuit system 104 includes qubit devices 105 arranged in a two-dimensional device array. Each of the qubit devices 105 has an associated flux-bias device 109 and an associate reset element 107. The quantum processor cell 102A may include additional or different features, and the components may be configured as shown or in another manner.

The qubit devices 105 each store a single qubit of information, and the qubits collectively represent the computational state of a quantum processor. In some cases, the quantum integrated circuit system 104 may include resonator devices coupled to the respective qubit devices, for instance, where each qubit device is capacitively coupled to an associated resonator device. The readout devices may be configured to generate readout signals that indicate the computational state of the quantum processor or quantum memory. In some examples, the quantum processor cell 102A includes coupler devices that selectively operate on individual qubits or pairs of qubits. For example, the coupler devices may produce entanglement or other multi-qubit states over two or more qubits. The quantum integrated circuit system 104 may include additional devices (e.g., additional qubit devices, coupler devices and other types of devices).

In the example shown, each qubit device 105 defines a transition frequency between the two quantum states (e.g., a ground state and first excited state) of an individual qubit. The example qubit devices 105 are tunable-frequency qubit devices, in which the transition frequencies are tunable, for example, by application of an offset field. For instance, a tunable qubit device may include a superconducting loop (e.g., a SQUID loop) that is tunable by application of magnetic flux. In some examples, the tunable qubit devices are implemented as tunable transmon qubit devices, flux qubit devices, flatsonium qubit devices, fluxonium qubit devices, or other types of tunable devices. In some examples, a tunable qubit device includes a superconducting circuit loop that receives a magnetic flux that tunes the transition frequency of the tunable qubit device. As an example, the superconducting circuit loop may include two Josephson junctions, and the tunable qubit device may also include a capacitor structure in parallel with each of the two Josephson junctions.

The transition frequency of the tunable qubit device may be defined at least in part by Josephson energies of the two Josephson junctions, a capacitance of the capacitor structure and a magnetic flux threading the superconducting circuit loop. For example, the magnetic flux $\Phi(t)$ through the SQUID loop can be modified in order to tune the transition frequency of the qubit device. In some cases, an inductor or other type of flux-bias device 109 is coupled to the SQUID loop by a mutual inductance, and the magnetic flux $\Phi(t)$ through the SQUID loop can be controlled by the current through the flux-bias device 109. In some cases, a coupling strength can be controlled by both AC and DC components of the current.

In some cases, the quantum integrated circuit system 104 includes one or more fixed-frequency qubit devices, whose transition frequencies are not tunable by application of an offset field and are independent of magnetic flux experienced by the qubit device. For instance, a fixed-frequency qubit device may have a fixed transition frequency that is defined by an electronic circuit of the qubit device. As an example, a superconducting qubit device (e.g., a fixed-frequency transmon qubit or another type of fixed-frequency qubit device.) may be implemented without a SQUID loop. In some examples, a fixed-frequency qubit device includes a single Josephson junction, and the transition frequency of the fixed-frequency qubit device is defined at least in part by a Josephson energy of the Josephson junction (independent of a magnetic flux experienced by the fixed-frequency qubit device).

In some instances, the quantum integrated circuit system 104 includes fixed-frequency qubit devices coupled to the tunable-frequency qubit devices 105 shown in FIG. 1. The tunable-frequency qubit devices 105 can be selectively activated by an offset field that does not directly affect the information encoded in the fixed-frequency qubit devices. For instance, although the offset field may cause a tunable-frequency qubit device to interact with one of the fixed-frequency qubit devices, the offset field does not modify the transition frequencies of the other fixed-frequency qubit devices (even if the fixed-frequency qubit devices experience the offset field). In this manner, the combination of tunable qubit devices with fixed-frequency qubit devices may allow selective, on-demand coupling of qubit devices while improving performance of the qubit devices. For example, the qubit devices may have longer coherence times, may be more robust against environmental or applied offset fields, etc.

The example quantum integrated circuit system 104 also includes connections 103 between neighboring pairs of the qubit devices 105. The connections 103 can provide electromagnetic communication between the connected circuit devices. In some cases, the connections 103 are implemented as capacitive or conductive connections. For instance, the connections 103 may include metal traces, capacitors, bonds and other components. The qubit devices 105 may be operated by microwave signals delivered in the quantum integrated circuit system 104, for example, from the control system 110. Signals may be exchanged among the qubit devices 105 through the connections 103 or other signal pathways in the quantum integrated circuit system 104.

In the example shown in FIG. 1, each qubit device 105 has an associated reset element 107. The reset element 107 can be, for example, a defect, a transmission line, another qubit device, or another hardware element in the quantum integrated circuit system 104. The example reset elements 107 provide a frequency-dependent $T_1$ process for the respective qubit devices, which can be used to selectively reset individual qubits in the quantum integrated circuit system 104. For instance, a reset element 107 coupled to a qubit device 105 can provide strong coupling between an environment and the qubit device 105 when the qubit device is tuned to a certain frequency range, thus activating a short-$T_1$ process that can be used for reset operations. The frequency dependence of the $T_1$ process also includes at least one frequency range where the reset element 107 is not activated and the $T_1$ process is much longer. Accordingly, the reset elements 107 can be selectively activated by using the flux bias devices 109 to tune individual qubit devices 105 (e.g., between short-$T_1$ operating states and long-$T_1$ operating states).

In some cases, the reset elements 107 can be described as multi-level systems (e.g., two-level systems) that provide a relaxation pathway for individual qubits devices 105. The relaxation pathway transfers energy from the qubit device 105 to an environment of the qubit device 105, and the relaxation pathway has a frequency-dependent energy transfer rate. In other words, the rate at which the reset element 107 transfers energy from the qubit device 105 to its environment varies in response to the operating frequency of the qubit device 105.

In some implementations, the reset elements 107 are implemented as hardware defects in the quantum integrated circuit system 104. For example, material defects may be inadvertently introduced by a fabrication process that is used to produce the quantum integrated circuit system 104. Examples of material defects that can provide a frequency-dependent $T_1$ value include lattice defects in the crystal structure of the quantum processor substrate (vacancies, inclusions and color centers, for example), surface defects in an oxide layer near the surface of the quantum processor substrate (including dangling bonds), other impurities, etc. As another example, the reset elements 107 may be implemented as defective hardware elements in the quantum integrated circuit system. Examples of defective engineered elements that provide a frequency-dependent $T_1$ value include qubit devices that do not perform to specification (e.g., due to unacceptably high decoherence rates, or other issues), resonator devices that do not perform to specification (e.g., due to unacceptably high decoherence rates, or other issues), or other types of defective engineered hardware components. In some cases, the reset elements 107 may be implemented as purposefully-designed elements that appear as artificial defects. In some cases, the reset element 107 can include a lossy acoustic or mechanical resonance at some particular frequency within the tunable range of a qubit device. In some embodiments, the reset element 107 can include a two-level system (TLS), that may exist on the surface of the superconducting electrode or in the tunnel junctions, for example. A TLS can have an energy comparable to the transition frequency of a superconducting qubit for a rapid relaxation of the qubit to the ground state. Since TLS's possess both electric and elastic dipole moments by which they couple to their environment, they generate noise in various devices including microwave resonators and superconducting qubits. In state-of-the-art superconducting qubits, interaction with individual TLSs can constitute a decoherence mechanism. TLSs can be coherently controlled, enabling prediction of their effect on qubit relaxation. This controlled coupling to the qubit allows a fast reset of qubits.

In some implementations, the reset elements 107 are implemented as engineered hardware components in the quantum integrated circuit system 104. For example, the reset elements 107 may be implemented as transmission lines that provide frequency-dependent coupling between the qubit device 105 and an external environment. As another example, the reset elements 107 may be implemented as ancilla qubit devices (e.g., as fixed-frequency qubit devices connected to the qubit devices 105) that have frequency-dependent coupling with the qubit devices 105. In some cases, the ancilla qubit devices do not require dedicated readout resonators or flux-bias devices, and therefore can be deployed in the quantum integrated circuit system 104 with a smaller footprint and lower hardware overhead than the primary qubit devices 105. As another example, the reset elements 107 could be any type of engineered, lossy mode that is tunable. For instance, the reset elements 107 may be implemented as tunable-frequency qubit devices, which may be similar to or different from the qubit devices 105.

In the example shown, the signal delivery system 106 provides communication between the control system 110 and the quantum processor cell 102. For example, the signal delivery system 106 can receive control signals from the control system 110 and deliver the control signals to the quantum processor cell 102. In some instances, the signal delivery system 106 performs preprocessing, signal conditioning, or other operations to the control signals before delivering them to the quantum processor cell 102. In some instances, the signal delivery system 106 receives qubit readout signals from the quantum processor cell and delivers the qubit readout signals to the control system 110. In some instances, the signal delivery system 106 performs preprocessing, signal conditioning or other operations on the readout signals before delivering them to the control system 110. In some implementations, the signal delivery system 106 includes input and output processing hardware, input and output connections, and other components. The input and processing hardware may include, for example, filters, attenuators, directional couplers, multiplexers, diplexers, bias components, signal channels, isolators, amplifiers, power dividers and other types of components.

In the example quantum computing system 100 shown, the control system 110 controls operation of the quantum processor cell 102. The example control system 110 may include data processors, signal generators, interface components and other types of systems or subsystems. In some cases, the control system 110 includes one or more classical computers or classical computing components. The example control system 110 includes processors 112, memory 114, waveform generators 116, amplifiers 117, digitizers 118, high-frequency sources 119 and DC sources 120. A control system may include additional or different features and components.

In some implementations, the control system 110 includes a classical computing cluster, servers, databases, networks, or other types of classical computing equipment. For instance, the memory 114 can include, for example, a random access memory (RAM), a storage device (e.g., a read-only memory (ROM) or others), a hard disk, or another type of storage medium. The memory 114 can include various forms of memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processors 112 may include one or more single- or multi-core microprocessors, one or more FPGAs or ASICs, one or more other types of data processing apparatus.

In the example shown, the waveform generators 116 and the DC sources 120 can each generate control signals based on control information provided by the processors 112. The control signals can be delivered to the quantum processor cell 102 by the signal delivery system 106, for example, and interact with the qubit devices 105. In the example shown, the digitizers 118 can receive and process signals from the quantum processor cell 102. For example, the received signals can be mixed with reference signals from the high-frequency sources 119 and digitized by digitizers 118. The digitizers 118 and other processing hardware can process (e.g., digitize, or otherwise process) the signals from the quantum processor cell 102 and provide the processed information to the processors 112. The processors 112 can extract data, for example, to identify the quantum states of qubits in the quantum processor cell 102 or for other purposes.

Figure 2:
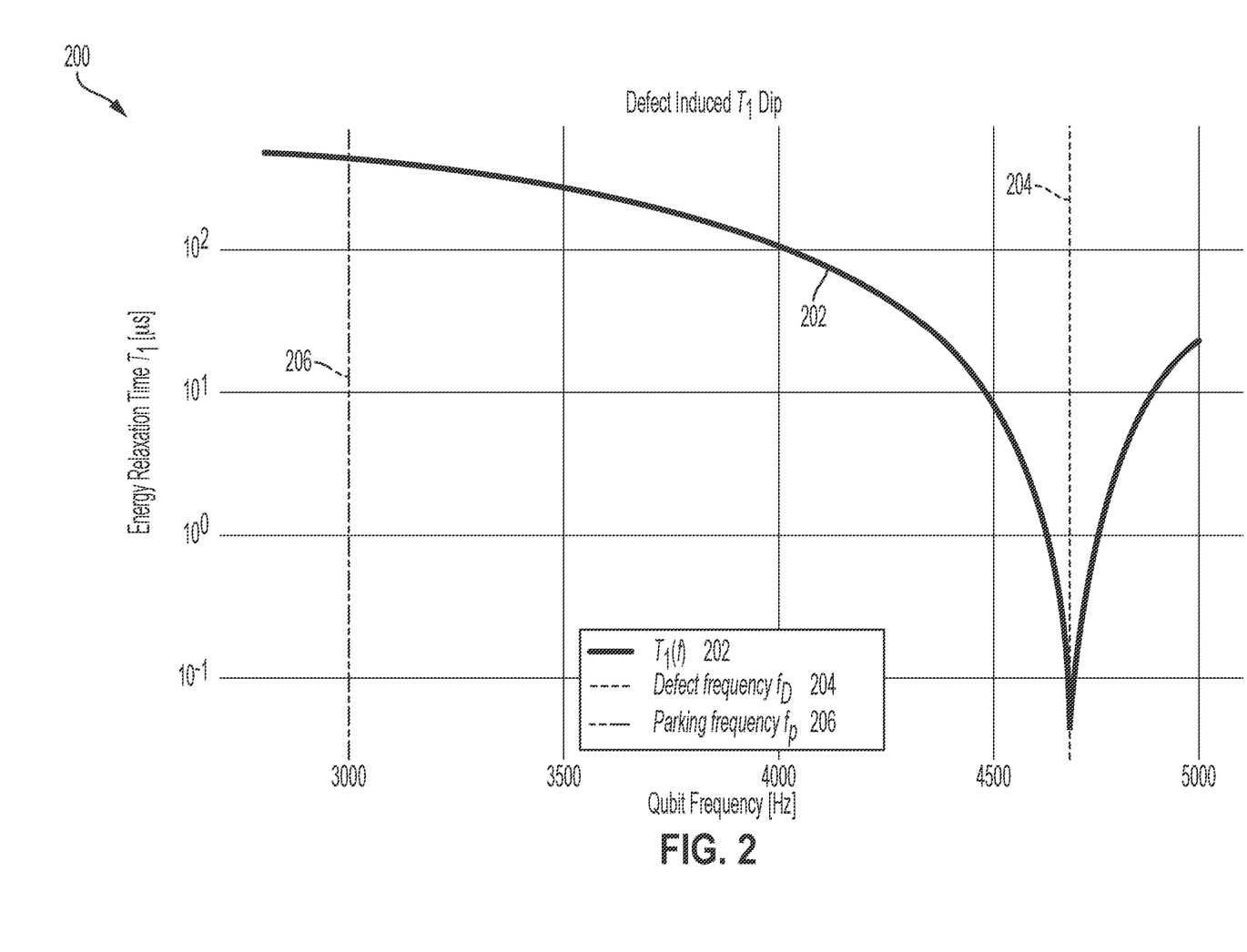
FIG. 2 is a plot of $T_1$ versus frequency for an example qubit device.

FIG. 2 is a plot 200 of $T_1$ versus frequency for an example qubit device. In particular, the plot 200 shows numerically-computed values of $T_1$ for an example tunable-frequency qubit device. The tunable-frequency qubit device has a ground state and a first-excited state that can be used as a qubit in quantum computing operations. The horizontal axis in the plot 200 represents a range of values for the qubit frequency (units of Hz), which is the frequency corresponding to the energy difference between the ground state and the first-excited state. The vertical axis in the plot 200 represents a range of $T_1$ values (units of microseconds, μs) for the qubit defined by the qubit device.

The example qubit device represented by the data shown in FIG. 2 includes a material defect or a lossy electromagnetic or mechanical mode that couples to the qubit that provides a frequency-dependent $T_1$ value. The material defect is of the type that can be inadvertently (or purposefully) introduced by fabrication processes that are used to produce superconducting qubit devices or purposefully engineered to be present at a specific frequency. Examples of material defects that can provide a frequency-dependent $T_1$ value include lattice defects in the crystal structure of the qubit device substrate and surface defects in an oxide layer near the surface of the qubit device substrate. Examples of lossy electromagnetic modes include modes that are engineered to localize in certain lumped superconducting elements near a qubit device which couple to the environment.

Examples of lossy mechanical modes can be realized via elastic mechanical displacement of atoms in the substrate either in the bulk or at the surface of the material. Such degrees of freedom can couple to electromagnetic degrees of freedom via piezo-electric effects.

The curve 202 shows the $T_1$ value of the qubit over qubit frequencies ranging from less than 3000 Hz to 5000 Hz. As shown in the plot 200, the $T_1$ value generally ranges from greater than 100 us to less than 0.1 μs. In this example, the wide range of $T_1$ values is caused by the material defect associated with the qubit device. As shown, at a qubit defect frequency $f_D$ (represented by the vertical line 204), the qubit has a minimum $T_1$ value; at a qubit parking frequency $f_p$ (represented by the vertical line 206), the qubit has a significantly higher $T_1$ value. In this example, the larger-$T_1$ value at the qubit parking frequency $f_p$ is over three orders of magnitude larger than the smaller-$T_1$ value at the qubit defect frequency $f_D$.

In this example, the qubit can be tuned to the qubit parking frequency $f_p$, or within a specified range about the qubit parking frequency $f_p$, where the $T_1$ value is large enough to preserve information in the qubit during a quantum algorithm. To reset the state of the qubit, the qubit can be tuned to the qubit defect frequency $f_p$, or within a specified range about the qubit defect frequency $f_p$, where the $T_1$ value is small enough to quickly transition the qubit to its ground state from any arbitrary state. The specific values shown in the plot 200 are provided as an example; a qubit device may have $T_1$ values in a different range, and the variation of $T_1$ versus qubit frequency can have another form or characteristic. For example, the large-$T_1$ value can be one, two, three or more orders of magnitude larger than the small-$T_1$ value. This example shows that it should be possible to modulate $T_1$ from hundreds of microseconds at the parking point to approximately 100 ns at the defect frequency.

Figure 3:
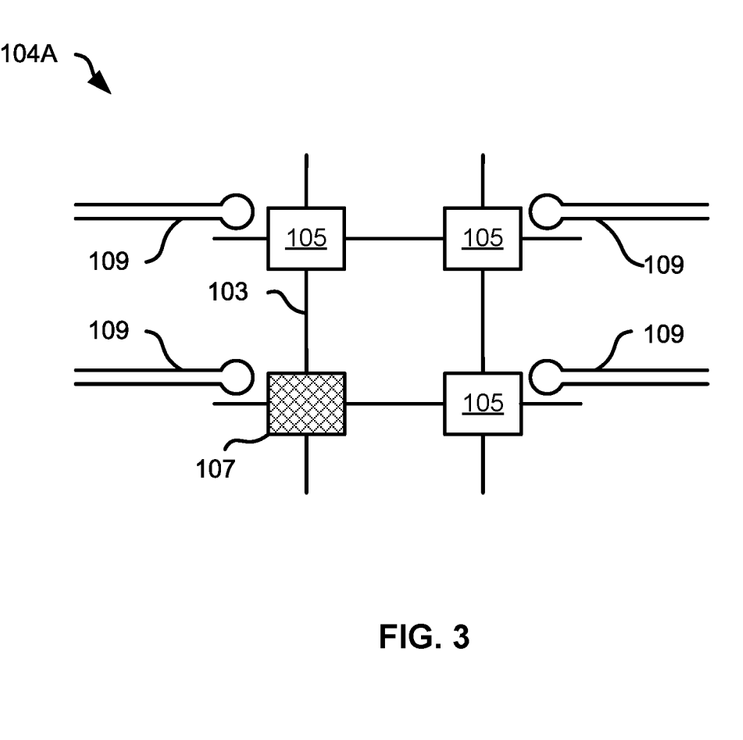
FIG. 3 is a diagram of an example quantum integrated circuit system.

FIG. 3 is a diagram of an example quantum integrated circuit system 104A. The quantum integrated circuit system 104A shown in FIG. 3 may represent a portion of a larger quantum circuit system that includes additional components. In some cases, the quantum integrated circuit system 104A is implemented as a superconducting circuit in a quantum processor (e.g., in the quantum processor cell 102 shown in FIG. 1).

The example quantum integrated circuit system 104A includes circuit devices arranged in a two-dimensional device array. The circuit devices in the array include qubit devices 105 (three shown in FIG. 3) and reset elements 107 (one shown in FIG. 3). Each circuit device has an associated flux-bias device 109. The quantum integrated circuit system 104A may include additional or different features, and the components may be configured as shown or in another manner.

In the example shown in FIG. 3, the reset element 107 is a qubit device that does not perform to specification, for example, due to unacceptably low coherence times (i.e., unacceptably high decoherence rates) or another defect. The reset element 107 shown in FIG. 3 is an example of a defective component that can be used for qubit reset operations. For instance, either of the respective qubit devices 105 that neighbor the reset element 107 in the quantum integrated circuit system 104A can be selectively coupled to the reset element 107 to perform a reset operation on the qubit defined by the qubit device 105. In particular, the flux-bias device 109 associated with a qubit device 105 may tune the qubit device 105 to a frequency range where the coupling with the reset element 107 significantly increases the effective energy relaxation rate of the qubit device (e.g., by one, two, three or more orders of magnitude).

Figure 4:
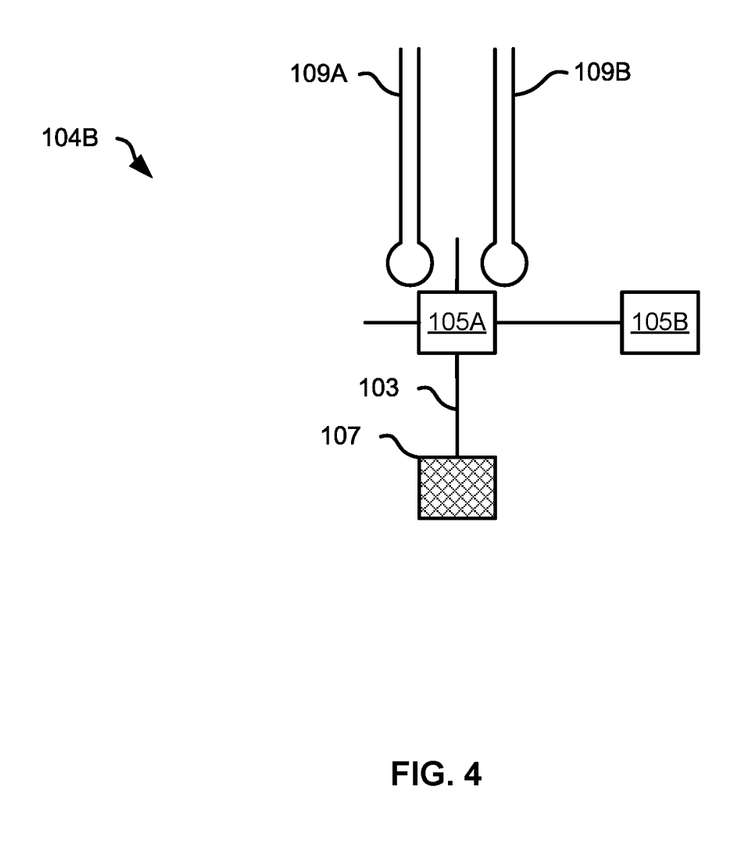
FIG. 4 is a diagram of another example quantum integrated circuit system.

FIG. 4 is a diagram of an example quantum integrated circuit system 104B. The quantum integrated circuit system 104B shown in FIG. 4 may represent a portion of a larger quantum circuit system that includes additional components. In some cases, the quantum integrated circuit system 104B is implemented as a superconducting circuit in a quantum processor (e.g., in the quantum processor cell 102 shown in FIG. 1).

The example quantum integrated circuit system 104B includes circuit devices arranged in a two-dimensional device array. The circuit devices in the array include qubit devices 105A, 105B (two shown in FIG. 4) and reset elements 107 (one shown in FIG. 4). The qubit device 105A has two associated flux-bias devices—a reset bias device 109A and a logic bias device 109B. The quantum integrated circuit system 104B may include additional or different features, and the components may be configured as shown or in another manner.

The two example flux bias devices 109A, 109B are configured to apply different ranges of magnetic flux bias to the qubit device 105A. The logic bias device 109B can have a narrower operating range compared to the reset bias device 109A; for instance, the logic bias device 109B can apply a smaller range of magnetic flux to tune the qubit device 105A. The reset bias device 109A can have a broader operating range compared to the logic bias device 109B; for instance, the reset bias device 109A can apply a larger range of magnetic flux to tune the qubit device 105B.

The two flux bias devices 109A, 109B can be used for different types of operations. The example logic bias device 109B can be used for applying coherent quantum logic gates or other types of coherent quantum control operations to the qubit defined by the qubit device 105A. For instance, the logic bias device 109B may be used to perform a single-qubit rotation on the qubit defined by the qubit device 105A, or to apply a two-qubit entangling gate on a pair of qubits defined by the qubit devices 105A, 105B. Operating a flux bias device that has only a narrow range of flux bias available can reduce the amount of flux noise affecting the qubit, thereby reducing errors. Thus, the narrower tuning range may be useful for certain types of coherent processes.

The example reset logic bias device 109A can be used for applying a qubit reset gate or other reset operation to the qubit defined by the qubit device 105A. For instance, the reset bias device 109A may be used to perform a reset gate that utilizes an energy relaxation process or other decoherent process. Operating a flux bias device that has a broad range of flux bias available can increase the tunable frequency range of the qubit device, in some cases, providing selective access to fast relaxation processes. Thus, the broader tuning range may be useful for certain types of decoherent processes.

Similar to the example shown in FIG. 3, the reset element 107 shown in FIG. 4 is a qubit device that does not perform to specification, for example, due to unacceptably low coherence times or another defect. The reset element 107 shown in FIG. 4 can be implemented as another type of reset element. For instance, the reset element 107 in FIG. 4 may be implemented as a defect formed by a fabrication process, a transmission line, or another type of component.

In a general aspect, qubit states are reset in a quantum computing system.

In an example, a quantum integrated circuit system includes a qubit device and a reset element associated with the qubit device. A qubit defined by the qubit device is reset by tuning the qubit device to a frequency range that couples the qubit device with the reset element.

Implementations of these and other examples may include one or more of the following features. The coupling generated by the tuning increases the energy relaxation rate of the qubit. A flux-bias device applies an offset field that tunes the qubit device. The reset element is a material defect in the quantum integrated circuit system, an engineered component of the quantum integrated circuit system (e.g., a transmission line), or a defective component of the quantum integrated circuit system (e.g., a defective qubit device).

In another general aspect, a quantum computing method includes identifying a tunable qubit device that exhibits a frequency-dependent energy relaxation process in a quantum processor cell. The frequency-dependent energy relaxation process is produced by a material defect in the quantum processor cell. The quantum computing method also includes identifying a first qubit frequency associated with a first relaxation time of the tunable qubit device and identifying a second qubit frequency associated with a second relaxation time of the tunable qubit device (e.g., as shown in FIG. 2). The second relaxation time is shorter than the first relaxation time due to the frequency-dependent energy relaxation process produced by the material defect.

For example, FIG. 2 depicts a plot 200 of numerically-computed values of $T_1$ of an example tunable-frequency qubit device identified to have a frequency-dependent energy relaxation process, as shown by curve 202. The first qubit frequency can be, for example, the $T_1$ value at the qubit parking frequency $f_p$ (represented by the vertical line 206) or another $T_1$ value on curve 202 below the qubit defect frequency $f_D$ (represented by the vertical line 204). The second qubit frequency can be, for example, the $T_1$ value at or near the qubit defect frequency $f_D$ (represented by the vertical line 204).

Implementations of the general aspect may include one or more of the following features. The quantum computing method additionally includes operating the tunable qubit device at the first qubit frequency while processing quantum information in the quantum processor cell, and tuning the tunable qubit device from the first qubit frequency to the second qubit frequency. The quantum computing method further includes resetting a qubit state of the qubit device by the frequency-dependent energy relaxation process produced by the material defect.

Implementations of the general aspect may include one or more of the following features. The quantum processor cell includes a reset element associated with the tunable qubit device. The reset element includes the material defect. Tuning the tunable qubit device from the first qubit frequency to the second qubit frequency increases a coupling between the reset element and the tunable qubit device.

Implementations of the general aspect may include one or more of the following features. The quantum processor cell houses a quantum integrated circuit system that includes the tunable qubit device, and the material defect includes one or more of a lattice defect, a surface defect or a defective hardware element of the quantum integrated circuit system. The quantum processor cell may also include a flux-bias device associated with the tunable qubit device, and tuning the tunable qubit device from the first qubit frequency to the second qubit frequency includes modifying a current through the flux-bias device. In some instances, the tunable qubit device, the reset element, and the flux-bias device are disposed on a substrate, and the material defect may include a lattice defect in a crystal structure of the substrate or a surface defect near a surface of the substrate.

Implementations of the general aspect may include one or more of the following features. Resetting the qubit state includes holding the tunable qubit device at the second qubit frequency for a specified amount of time. Resetting the qubit state transitions the qubit device to its ground state. The second relaxation time is less than one tenth of the first relaxation time. In some implementations, the second relaxation time is less than one hundredth of the first relaxation time. The first relaxation time is greater than or equal to 10 microseconds (µs). In some implementations, the second relaxation time is less than or equal to 1 microsecond (µs).

In another general aspect, a quantum computing system includes a quantum processor cell comprising a plurality of qubit devices. The plurality of qubit devices includes one or more tunable qubit devices. The quantum computing system also includes a control system communicably coupled to the quantum processor cell and configured to perform operations that include identifying a tunable qubit device in the plurality of qubit devices that exhibits a frequency-dependent energy relaxation process in a quantum processor cell. The frequency-dependent energy relaxation process is produced by a material defect in the quantum processor cell. The operations also include identifying a first qubit frequency associated with a first relaxation time of the tunable qubit device and identifying a second qubit frequency associated with a second relaxation time of the tunable qubit device. The second relaxation time is shorter than the first relaxation time due to the frequency-dependent energy relaxation process produced by the material defect.

Implementations of the general aspect may include one or more of the following features. The operations of the control system additionally include operating the tunable qubit device at the first qubit frequency while processing quantum information in the quantum processor cell and tuning the tunable qubit device from the first qubit frequency to the second qubit frequency. The operations of the control system further include resetting a qubit state of the qubit device by the frequency-dependent energy relaxation process produced by the material defect.

Implementations of the general aspect may include one or more of the following features. The quantum processor cell includes a reset element associated with the tunable qubit device. The reset element includes the material defect. Tuning the tunable qubit device from the first qubit frequency to the second qubit frequency increases a coupling between the reset element and the tunable qubit device.

Implementations of the general aspect may include one or more of the following features. The quantum processor cell houses a quantum integrated circuit system that includes the tunable qubit device, and the material defect includes one or more of a lattice defect, a surface defect or a defective hardware element of the quantum integrated circuit system. The quantum processor cell may also include a flux-bias device associated with the tunable qubit device, and tuning the tunable qubit device from the first qubit frequency to the second qubit frequency includes modifying a current through the flux-bias device. In some instances, the tunable qubit device, the reset element, and the flux-bias device are disposed on a substrate, and the material defect may include a lattice defect in a crystal structure of the substrate or a surface defect near a surface of the substrate.

Implementations of the general aspect may include one or more of the following features. Resetting the qubit state includes holding the tunable qubit device at the second qubit frequency for a specified amount of time. Resetting the qubit state transitions the qubit device to its ground state. The second relaxation time is less than one tenth of the first relaxation time. The second relaxation time is less than one hundredth of the first relaxation time. The first relaxation time is greater than or equal to 10 microseconds (µs). The second relaxation time is less than or equal to 1 microsecond (µs).

Implementations of the general aspect may include one or more of the following features. The quantum computing system includes a logic flux bias device electromagnetically-coupled to the tunable qubit device and configured to apply a first range of magnetic flux bias to the tunable qubit device. In these implementations, the quantum computing system also includes a reset flux bias device configured to apply a second range of magnetic flux bias to the tunable qubit device that is broader than the first range of magnetic flux bias.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A quantum computing method comprising:
   identifying a tunable qubit device that exhibits a frequency-dependent energy relaxation process in a quantum processor cell, wherein the frequency-dependent energy relaxation process is produced by a material defect in the quantum processor cell;
   identifying a first qubit frequency associated with a first relaxation time of the tunable qubit device;
   identifying a second qubit frequency associated with a second relaxation time of the tunable qubit device, wherein the second relaxation time is shorter than the first relaxation time due to the frequency-dependent energy relaxation process produced by the material defect;
   operating the tunable qubit device at the first qubit frequency while processing quantum information in the quantum processor cell;
   tuning the tunable qubit device from the first qubit frequency to the second qubit frequency; and
   resetting a qubit state of the tunable qubit device by the frequency-dependent energy relaxation process produced by the material defect.

2. The method of claim 1, wherein the quantum processor cell comprises a reset element associated with the tunable qubit device, the reset element comprises the material defect, and tuning the tunable qubit device from the first qubit frequency to the second qubit frequency increases a coupling between the reset element and the tunable qubit device.

3. The method of claim 2, wherein the quantum processor cell houses a quantum integrated circuit system that includes the tunable qubit device, and the material defect comprises one or more of a lattice defect, a surface defect or a defective hardware element of the quantum integrated circuit system.

4. The method of claim 2, wherein the quantum processor cell comprises a flux-bias device associated with the tunable qubit device, and tuning the tunable qubit device from the first qubit frequency to the second qubit frequency comprises modifying a current through the flux-bias device.

5. The method of claim 4, wherein the tunable qubit device, the reset element, and the flux-bias device are disposed on a substrate, and the material defect comprises a lattice defect in a crystal structure of the substrate or a surface defect near a surface of the substrate.

6. The method of claim 1, wherein the second relaxation time is less than one tenth of the first relaxation time.

7. The method of claim 1, wherein the second relaxation time is less than one hundredth of the first relaxation time.

8. The method of claim 1, wherein resetting the qubit state comprises holding the tunable qubit device at the second qubit frequency for a specified amount of time.

9. The method of claim 1, wherein resetting the qubit state transitions the tunable qubit device to its ground state.

10. The method of claim 1, wherein the first relaxation time is greater than or equal to 10 microseconds (µs).

11. The method of claim 10, wherein the second relaxation time is less than or equal to 1 microsecond (µs).

12. A quantum computing system comprising:
    a quantum processor cell comprising a plurality of qubit devices, the plurality of qubit devices comprising one or more tunable qubit devices; and
    a control system communicably coupled to the quantum processor cell and configured to perform operations comprising:
      identifying a tunable qubit device in the plurality of qubit devices that exhibits a frequency-dependent energy relaxation process in the quantum processor cell, wherein the frequency-dependent energy relaxation process is produced by a material defect in the quantum processor cell,
      identifying a first qubit frequency associated with a first relaxation time of the tunable qubit device,
      identifying a second qubit frequency associated with a second relaxation time of the tunable qubit device, wherein the second relaxation time is shorter than the first relaxation time due to the frequency-dependent energy relaxation process produced by the material defect,
      operating the tunable qubit device at the first qubit frequency while processing quantum information in the quantum processor cell,
      tuning the tunable qubit device from the first qubit frequency to the second qubit frequency, and
      resetting a qubit state of the tunable qubit device by the frequency-dependent energy relaxation process produced by the material defect.

13. The quantum computing system of claim 12, wherein the quantum processor cell comprises a reset element associated with the tunable qubit device, the reset element comprises the material defect, and tuning the tunable qubit device from the first qubit frequency to the second qubit frequency increases a coupling between the reset element and the tunable qubit device.

14. The quantum computing system of claim 13, wherein the quantum processor cell houses a quantum integrated circuit system that includes the tunable qubit device, and the material defect comprises one or more of a lattice defect, a surface defect or a defective hardware element of the quantum integrated circuit system.

15. The quantum computing system of claim 13, wherein the quantum processor cell comprises a flux-bias device associated with the tunable qubit device, and tuning the tunable qubit device from the first qubit frequency to the second qubit frequency comprises modifying a current through the flux-bias device.

16. The quantum computing system of claim 15, wherein the tunable qubit device, the reset element, and the flux-bias device are disposed on a substrate, and the material defect comprises a lattice defect in a crystal structure of the substrate or a surface defect near a surface of the substrate.

17. The quantum computing system of claim 12, wherein the second relaxation time is less than one tenth of the first relaxation time.

18. The quantum computing system of claim 12, wherein the second relaxation time is less than one hundredth of the first relaxation time.

19. The quantum computing system of claim 12, wherein resetting the qubit state comprises holding the tunable qubit device at the second qubit frequency for a specified amount of time.

20. The quantum computing system of claim 12, wherein resetting the qubit state transitions the tunable qubit device to its ground state.

21. The quantum computing system of claim 12, wherein the first relaxation time is greater than or equal to 10 microseconds ($\mu s$).

22. The quantum computing system of claim 21, wherein the second relaxation time is less than or equal to 1 microsecond ($\mu s$).

23. The quantum computing system of claim 12, comprising:
- a logic flux bias device electromagnetically-coupled to the tunable qubit device and configured to apply a first range of magnetic flux bias to the tunable qubit device; and
- a reset flux bias device configured to apply a second range of magnetic flux bias to the tunable qubit device that is broader than the first range of magnetic flux bias.

* * * * *

UNITED STATES PATENT AND TRADEMARK OFFICE
CERTIFICATE OF CORRECTION

| | | |
|---|---|---|
| PATENT NO. | : 11,112,842 B1 | Page 1 of 1 |
| APPLICATION NO. | : 16/150776 | |
| DATED | : September 7, 2021 | |
| INVENTOR(S) | : Robert Stanley Smith et al. | |

It is certified that error appears in the above-identified patent and that said Letters Patent is hereby corrected as shown below:

In the Specification

Column 9, Line 24, Delete "$f_p$," and insert -- $f_D$, -- therefor

Column 9, Line 25, Delete "$f_p$," and insert -- $f_D$, -- therefor

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*